US008266969B2

(12) United States Patent
Abramson et al.

(10) Patent No.: US 8,266,969 B2
(45) Date of Patent: Sep. 18, 2012

(54) METHOD AND SYSTEM FOR MEASURING PROPERTIES OF MICROSTRUCTURES AND NANOSTRUCTURES

(75) Inventors: Alexis Abramson, Cleveland Heights, OH (US); Vikas Prakash, Richfield, OH (US); Utkarsha Singh, Cleveland, OH (US)

(73) Assignee: Case Western Reserve University, Cleveland, OH (US)

( * ) Notice: Subject to any disclaimer, the term of this patent is extended or adjusted under 35 U.S.C. 154(b) by 723 days.

(21) Appl. No.: 12/303,506

(22) PCT Filed: Jun. 7, 2007

(86) PCT No.: PCT/US2007/070610
§ 371 (c)(1),
(2), (4) Date: Dec. 4, 2008

(87) PCT Pub. No.: WO2008/073513
PCT Pub. Date: Jun. 19, 2008

(65) Prior Publication Data
US 2009/0194689 A1    Aug. 6, 2009

Related U.S. Application Data

(60) Provisional application No. 60/811,492, filed on Jun. 7, 2006, provisional application No. 60/815,323, filed on Jun. 21, 2006.

(51) Int. Cl.
*G01N 3/02* (2006.01)
*G01N 3/08* (2006.01)

(52) U.S. Cl. .............. 73/856; 73/788; 73/860; 977/880

(58) Field of Classification Search .................. 977/852, 977/880, 881; 73/788, 789, 790, 808, 811, 73/856, 860
See application file for complete search history.

(56) References Cited

U.S. PATENT DOCUMENTS

| 5,553,486 A | 9/1996 | Bonin |
| 5,576,483 A | 11/1996 | Bonin |
| 5,661,235 A | 8/1997 | Bonin |
| 5,869,751 A | 2/1999 | Bonin |
| 6,026,677 A | 2/2000 | Bonin |

(Continued)

OTHER PUBLICATIONS

Zhu, Yong et al., "A microelectromechanical load sensor for in situ electron and x-ray microscopy tensile testing of nanostructures." Appl. Phys. Lett. 86, 013506, published online Dec. 28, 2004.*

(Continued)

*Primary Examiner* — Lisa Caputo
*Assistant Examiner* — Punam Roy
(74) *Attorney, Agent, or Firm* — Tarolli, Sundheim, Covell & Tummino LLP

(57) ABSTRACT

A method is presented for characterizing properties of a specimen, such as a microstructure and a nanostructure. The method includes attaching a first end of the specimen to a first probe (204) and attaching a second end of the specimen, which is spaced apart from the first end by an intermediate portion, to a second probe that extends from a transducer (208). The method also includes causing a corresponding displacement of the specimen attached between the first probe and the second probe (224, 230). At least one parameter associated with the specimen is acquired (226, 232) during the corresponding displacement based on at least one output signal from the transducer. The properties of the specimen can be determined based on the at least one parameter (236, 238).

23 Claims, 5 Drawing Sheets

U.S. PATENT DOCUMENTS

| | | | |
|---|---|---|---|
| 6,532,805 B1* | 3/2003 | Kokawa et al. | 73/105 |
| 6,605,941 B2* | 8/2003 | Abe | 73/105 |
| 6,817,255 B2* | 11/2004 | Haque et al. | 73/862.638 |
| 7,586,105 B2* | 9/2009 | Molhave | 73/856 |
| 7,752,916 B2* | 7/2010 | Han et al. | 73/856 |
| 2002/0017146 A1* | 2/2002 | Oliver | 73/856 |
| 2010/0186520 A1* | 7/2010 | Wheeler et al. | 73/818 |

OTHER PUBLICATIONS

Zhu, Yong et al., "A thermal actuator for nanoscale in situ microscopy testing: design and characterization." J. Micromech. Microeng. 16, 242-253, published online Jan. 5, 2006.*

Hague et al., "Application of MEMS force sensors for in situ mechanical characterization of nano-scale thin films in SEM and TEM," Sensors and Actuators A 97-98 (2002) 239-245, accepted for publication Nov. 2001.

Treacy et al. "Exceptionally high Young's modulus observed for individual carbon nanotubes", Nature, vol. 381, Jun. 20, 1996.

Poncharal, Philippe, "Electrostatic Deflections and Electromechanical Resonances of Carbon Nanotubes," Science; Mar. 5, 1999, vol. 283, Issue 5407, p. 1513, (9 pages).

Shen, Weiden et al., "Investigation of the Radial Compression of Carbon Nanotubes with Scanning Probe Microscope," American Physical Society, vol. 84, No. 16, Apr. 17, 2000.

Yu, et al., "Strength and Breaking Mechanism of Multiwalled Carbon Nanotubes Under Tensile Load," Science 287, 637 (Jan. 2000); DOI: 10.1126/science.287.5453.637.

Yu, et al., "Three-dimensional manipulation of carbon nanotubes under a scanning electron microscope," Nanotechnology 10(1999) 244-252.

Zhu, Yong et al., "A microelectromechanical load sensor for in situ electron and x-ray microscopy tensile testing of nanostructures," Applied Physics Letters 86, 013506 (2005), download Jun. 2007.

\* cited by examiner

METHOD AND SYSTEM FOR MEASURING PROPERTIES OF MICROSTRUCTURES AND NANOSTRUCTURES

RELATED APPLICATION

The present application claims the benefit of U.S. Provisional Application No. 60/811,492, filed Jun. 7, 2006, and of U.S. Provisional Application No. 60/815,323, filed Jun. 21, 2006, both which are incorporated herein by reference in their entirety.

GOVERNMENT FUNDING

This invention was made with government support under Grant No. NSF-CTS0521364, NSF-CMS0521364 and NSF-CMS02014145 awarded by the National Science Foundation. The government may have certain rights in the invention.

TECHNICAL FIELD

This invention relates to measuring and testing and, more particularly to a method and system for measuring properties of microstructures and nanostructures.

BACKGROUND

Micro-/nanoscale structures, such as nanotubes and nanowires, demonstrate significant potential for use in a variety of engineering devices and systems. The existence and availability of adequate tools for to characterize properties of micro-/nanoscale structures is a prerequisite for the advancement and further development of such materials. Currently, there is a lack of adequate tools, which tends to hamper efforts to characterize micro-/nanoscale structures.

Several experimental techniques have been developed to capture certain aspects of nanomechanical behavior, such as the elastic modulus of individual nanostructures. These techniques include, for example, indirect methods such as the study of vibrations/oscillations in nanostructures induced by thermal vibrations or applications of an electric field with a tunneling electron microscope (TEM). Scanning probe microscopy methods, such as the atomic force microscopy (AFM), have also been employed to evaluate the mechanical properties of nanostructures and microstructures. These techniques were further advanced by combining a piezo-actuated nanomanipulator with an AFM probe tip inside a scanning electron microscope (SEM) of TEM. Others existing approaches include the use of micro-electro-mechanical systems (MEMS) based test devices for in-situ mechanical testing of nanostructures inside a SEM.

SUMMARY

This invention relates generally to measuring and testing and more particularly to a method and system for measuring properties of microstructures and nanostructures.

One aspect of the invention provides a method for characterizing properties of a specimen, such as a microstructure and a nanostructure. The method includes attaching a first end of the specimen to a first probe and attaching a second end of the specimen, which is spaced apart from the first end by an intermediate portion, to a second probe that extends front a transducer. The method also includes causing a corresponding displacement of the specimen attached between the first probe and the second probe. At least one parameter associated with the specimen is acquired during the corresponding displacement based on at least one output signal from the transducer. The properties of the specimen can be determined based on the at least one parameter.

Another aspect of the invention provides a method for characterizing properties of a specimen, such as a microstructure and a nanostructure. The method includes attaching a first end of the specimen to a first probe and attaching a second end of the specimen to a second probe that extends from a transducer, the transducer being configured to impart substantially linear force along at least one direction. The specimen is aligned to extend between the first probe and the second probe along an axis having a defined orientation relative to the at least one direction. The transducer is actuated to impart the substantially linear force along a given direction that causes a corresponding displacement of the specimen along the axis. The method also includes measuring parameters associated with the specimen during the corresponding displacement based on at least one output signal from the transducer.

Yet another aspect of the invention provides a system to characterize properties of a micro-/nanoscale specimen. The system includes means for holding a first end of the specimen at first position and includes means for holding a second end of the specimen at a second position, such that a length of the specimen extending between each of the respective means for holding is substantially aligned with an axis. The system also includes means for causing a corresponding displacement of the specimen relative to the axis by effecting movement of at least one of the means for holding. The system also includes means for measuring parameters indicative of force and the corresponding displacement associated with the specimen during the corresponding displacement of the specimen based on at least one output signal from the transducer.

BRIEF DESCRIPTION OF THE DRAWINGS

The foregoing and other features of the invention will become apparent to those skilled in the art to which the invention relates upon reading the following description with reference to the accompanying drawings, in which.

DETAILED DESCRIPTION

The invention relates to a testing system and methods for characterizing properties of specimen, such as microstructures and nanostructures. Examples of nanostructures include, but are not limited to, nanowires and nanotubes. The properties of microstructures and nanostructures may include, for example, force, displacement, temperature, thermal conductivity and electrical resistance. Some of the properties (e.g., force and displacement of the specimen) may be acquired as raw data, while other properties can be computed based on raw data. For instance, various combinations of properties can be employed to determine various other characteristics of the specimen, such as stress (e.g., engineering stress or true stress), strain (e.g., engineering strain or true strain), as well as to characterize functional relationships between or among different properties.

Additionally, the specimen to be measured via systems and methods described herein can be a one-dimensional structure (e.g., any structure having a single physical dimension). As an example, since many nanowires and microfibers exhibit large aspect ratios (e.g., the length-to-width ratio of about 100 or more), nanowires and microfibers can be considered one-dimensional materials (e.g., as having a length dimension only). It is further contemplated that the systems and methods could be configured, based on the teachings contained herein, to measure the properties of two-dimensional materials (e.g., thin films) and three-dimensional materials.

Figure 1:
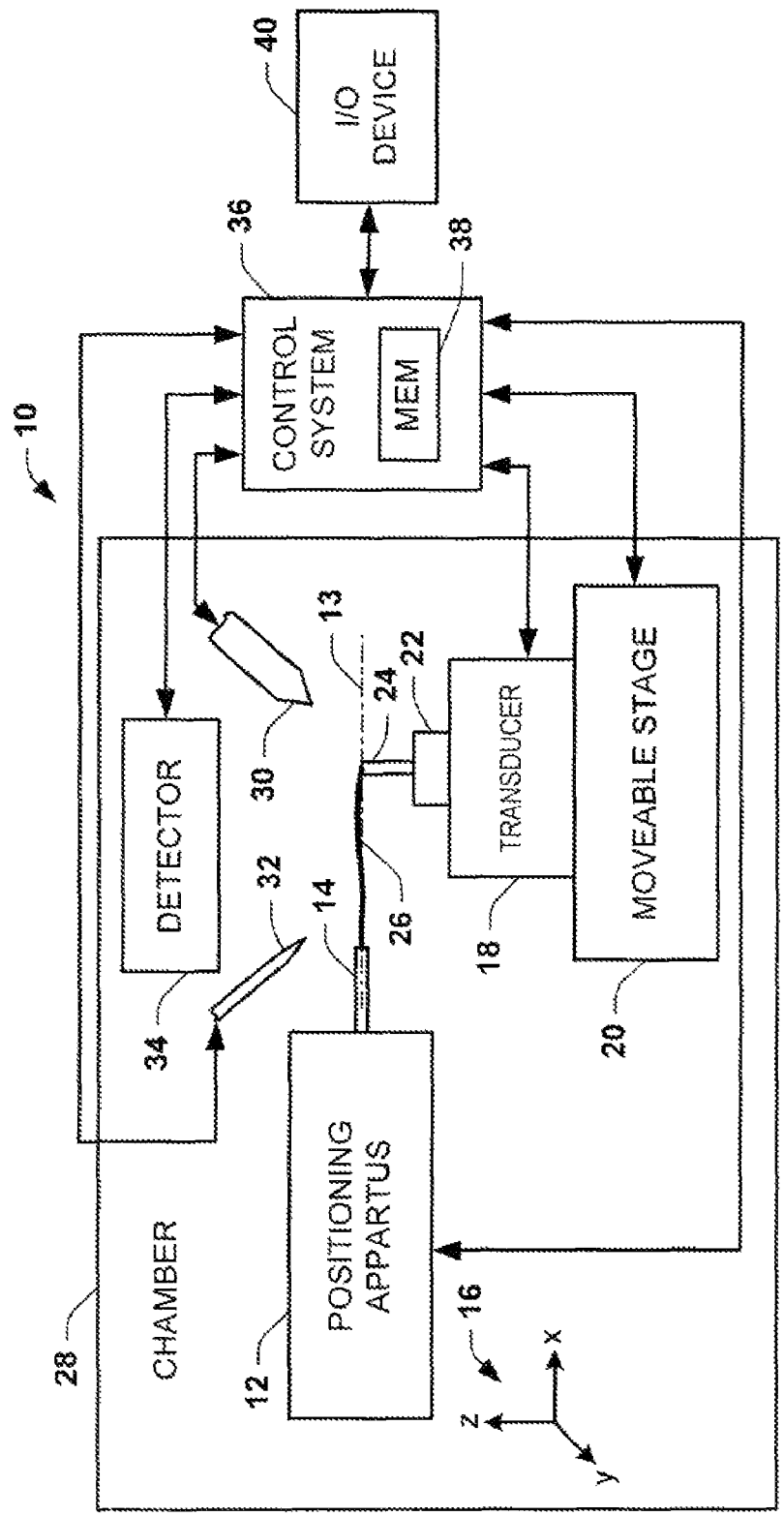
FIG. 1 depicts a block diagram of a system for measuring properties of a specimen according to an aspect of the invention.

Referring to FIG. 1, an example of a system 10 that can be implemented according to an aspect of the invention is depicted. The system 10 includes a positioning apparatus 12. The positioning apparatus 12 can be configured to provide for movement or positioning of an end part thereof along one or more axes. In the example of FIG. 1, a probe 14 extends from an end of positioning apparatus 12 along an axis 13 that is substantially parallel to an x-axis for the system. Also depicted in the system 10 is a three-dimensional x, y, z-axis for the system, demonstrated at 16. The positioning apparatus 12 thus can also be configured to provide for precise movement of the probe 14 along directions parallel to "y" and "z" axes of the system 10 as well as to provide for rotation of the probe about the probe axis 13. For example, the rotational degree of freedom can enable testing under pore torsion as well as can afford testing under combined tension and torsion loading of the specimen 26.

The positioning apparatus 12 can be implemented as a micromanipulator or a nanomanipulator. One example of such an apparatus is a micromanipulator (e.g., the MM3A micromanipulator) manufactured by Kleindiek Nanotechnik GmbH of Germany. Such micromanipulator can afford millimeter scale displacements at a sub-nanometer scale resolution that enables for precise manipulation of the specimens over large distances. The micromanipulator can also allow several additional degrees of freedom to one end of the specimen via independent and precise positioning in three-dimensional space. The positioning apparatus 12 may further be mounted on a linear stage (not shown) to extend the range of displacement that can be achieved during measurements. Those skilled in the art will understand and appreciate other types and configurations of positioning devices that can be utilized in accordance with an aspect of the invention.

The system 10 also includes a transducer 18 that is attached to a movable stage 20. The movable stage 20 can provide for linear movement of the transducer 18 parallel to one or more of the axes 16. The transducer 18 itself further may enable more precise displacement or movement of a holder (or end portion) 22 by controlling operation of the transducer (e.g., via control system 36). A probe 24 is connected with the holder 22 to provide for precise movement of the probe. In the example of FIG. 1, the probe 24 extends outwardly from a substantially planar surface of the transducer 18 and is thus oriented substantially orthogonal relative to the axis 13. The probe can further be positioned to substantially intersect with (or to terminate in an end that is substantially coincident with) the axis 13. The transducer 18, for example, may be configured to provide for linear movement of the holder 22 and the probe 24 along a single direction (e.g., parallel to the x-axis). Alternatively, the transducer 18 can provide for precise multidimensional displacement of the holder 22 and the probe 24 attached thereto.

As one example, the transducer 18 can be implemented as a one- or multi-dimensional force and displacement transducer. Such a transducer can be configured to actively generate forces by electrostatic means and to detect displacement by capacitive means (e.g., by a pair of capacitive transducers). For example, electrostatic voltage can be selectively applied to a given plate (or plates) to effect movement of a moveable plate in a particular direction. A mechanism can be attached to the moveable plate for transmitting force form such plate to the holder 22, for example. Additionally, displacement can be measured by capacitive means. For example, the displacement can be determined as a function of the distance between plates, such as may be determined by monitoring an output signal from a given plate that is proportional to the relative position of such plates in the transducer. Examples of such force and displacement transducers are disclosed in U.S. Pat. Nos. 5,576,483; 5,661,235; and 5,869,751 all of which are incorporated herein by reference. Commercial embodiments of force and displacement transducers that can be implemented in the system 10 are manufactured by Hysitron Incorporated, which is headquartered in Minneapolis, Minn.

In the example of FIG. 1, a length of a specimen, indicated at 26, is attached between tips of the probes 14 and 24. The specimen can be an elongated microstructure or nanostructure. The attachment of the specimen 26 to the probes 14 and 24 can be implemented by a nanowelding technique.

By way of example, the positioning apparatus 12, the transducer 18 and the stage 20 along with the probes 14 and 24 and the specimen 26 can be located within a chamber 28. The chamber 28, for example, can be a vacuum chamber, such as part of an electron microscope system that can be employed to acquire image data of one or more structures within the chamber. Examples of different types of electron microscopes that can be utilized in the system 10 to acquire images of the sample during testing with the system 10 include Transmission Electron Microscopes (TEM), Scanning Electron Microscopes (SEM), Reflection Electron Microscopes (REM), and Scanning Transmission Electron Microscopes (STEM).

Such SEM system can also include a beam system, indicated schematically at 30. While a single beam system 30 is depicted in the schematic example of FIG. 1, those skilled in the art will understand and appreciate that the system 10 can include dual or mufti beam systems, such as for applying both ion beams and electron beams in the chamber 28. Thus, for purposes of the example of FIG. 1, the beam system 30 can be considered to represent an ion beam system, an electron beam system or a dual or multi-beam system. That is, the beam system 30 can include an ion beam system configured to provide a focused ion beam to a specified focal point in the chamber 28. Additionally or alternatively, the beam system 30 can include an electron beam system configured (e.g., including an electron gun and electron column and lens structure) to provide an electron beam to a specified focal point in the chamber 30.

The system 10 may also include a gas injection system 32 that can inject appropriate gas or gases into the chamber 28. The gas injection system 32 can include any number of one or more gas injectors that can supply desired gas chemistry options into the chamber 28, such as for deposition or etching.

For example, appropriate chemistry can be supplied by the gas injection system 32 for platinum metal deposition or tungsten metal deposition.

The beam system 30 thus can generate a focused ion beam in conjunction with gas injected by the gas injection system 32 within the chamber 28 to provide means for attaching a first end of the specimen 26 to the tip of the probe 14 via ion beam induced deposition (IBID). Alternatively, the beam system 30 can provide an electron beam in conjunction with appropriate gas being injected into the chamber for performing electron-beam induced deposition (EBID) within the chamber 28. Thus, the beam system 30 can apply a focused beam to a desired focal point at the tip of the respective probes 14 and 24 for thereby depositing ions for forming an appropriate physical attachment (e.g., a nanoweld) between the specimen 26 and the probe tip.

As mentioned above, the system 10 can include an SEM system that includes nanowelding capabilities via the IBID or EBID processes. Those skilled in the art will understand and appreciate that such capabilities may be provided in SEM systems or the chamber 28 for performing the methods described herein. As one example, SEM systems with single and dual beam technology are manufactured by FEI Company of Hillsboro, Oreg. One particular example of such a dual beam SEM system in the FEI Dual-Beam Focused Ion Beam Scanning Electron Microscope model FEI XT Nova NanoLab 200. Predesigned kits are also available from various manufacturers and supplier for performing EBID and IBID, including those from the FEI Company mentioned herein. Those skilled in the art will further understand and appreciate that other means can be utilized to attach the specimen 26 to the probes 14 and 24 including, for example, other nanowelding techniques, chemical functionalization of the probe tip, and electromagnetic grippers to name a few.

The system 10 can also include a detector 34 also located within the chamber 28 for detecting electrons or particles depending upon the mode of operation. The detector 34, for example, can detect electrons and/or particles in response to scanning the electron beam (from the beam system 30) across the specimen. While, for purposes of simplicity of the illustration, a single detector 34 is depicted in FIG. 1, it will be understood and appreciated that the detector can be configured to detect electrons for use when electrons are provided by an electron beam system and/or the detector can include a particle detector for detecting particles generated by the sample by impact ions for the ion beam system.

The system 10 can also include a control system, schematically indicated at 36, for controlling the various components and their operation in the chamber 28. The control system 36 can be implemented as a single integrated control unit or, alternatively, as a plurality of separate control units that control different components and processes in the system 10. The control system 36 further can include memory 38 for storing parameters sensed by the transducer 18 as indicated by the appropriate sensor implemented within the transducer 18. The memory 38 can also include executable instructions for performing the control functions and computations described herein.

For example, the control system 36 can control the positioning apparatus 12 for positioning the probe at desired location in the chamber 28. Use of a precise positioning apparatus 12 (e.g., the micromanipulator mentioned above) can facilitate (a) nanowelding of the specimen. The control systems can also operate the micromanipulator to facilitate alignment of the specimen 26 along the axis 13 (e.g., corresponding to the load train) after the specimen has been anchored at both ends to the probes 14 and 24. The micromanipulator also affords opportunities for performing coupled thermal and electrical measurements in the nanostructures in the presence of mechanical strain, which can be utilized for characterizing more detailed properties and relationships for the specimen 26.

The control system 36 can control the transducer for measuring properties of the specimen during testing. The measured properties (e.g., force and displacement from the transducer 18) can be stored as raw data in the memory 38, for example. By way of example, the control system 36 can control the transducer 18 to change relative distance between the probe 14 and 16 to thereby cause a corresponding displacement of the specimen 26 attached between the probes. As used herein, the displacement of the specimen 26 that is attached between the probes corresponds a change in one or more dimensions of the specimen, such changing a length dimension to strain the specimen or rotating the specimen to impart torsion. The displacement further can include an increase or decreasing in the amount of displacement of the specimen, and can occur by actuating the transducer 18 accordingly. The length dimension of the specimen 26 is oriented substantially parallel to the axis 13.

Actuation of the transducer 18 can also be utilized to maintain alignment of the specimen 26 with the axis 13 during testing. For the example of a two-dimensional transducer 18, the control system 36 can control the transducer to measure a first force component that is substantially parallel with the axis 13 and a second force component that is substantially normal to the axis based on output signals from the transducer. The output signals can be employed to ascertain an indication of the alignment of the specimen 26 relative to the axis 13 based on the first and second force components. The indication of specimen alignment thus can be employed as feedback to (manually or automatically) adjust the position of one or both of the probes 14 and 24 to maintain alignment of the specimen with respect to the axis 13.

The control system 36 further can operate the various parts of the system during a loading phase and an unloading phase to acquire various parameters. The loading phase corresponds to a phase in which force is applied by the transducer 18 to elongate the specimen 26 gradually. The unloading phase corresponds to another test phase in which the applied force is gradually removed to reduce the length of the specimen from its strained condition back toward its initial condition. For example, the transducer 18 can impart force to displace the specimen 26 during the loading phase, such as at a predetermined increasing rate (e.g., about 0.5 μm/second). Between loading and unloading force on the specimen (and hence its length) can be maintained at a constant level for a specified dwell time. During the unloading phase, the transducer can remove force, such as at a predetermined decreasing rate.

The control system 36 can also control movement of the movable stage 20 along the axes 16, such as for coarse positioning of the transducer 18 and the associated probe 24. The control system 36 further can be programmed and/or configured for controlling the transducer 18, such as for actuating the probe 24 to apply force to effect corresponding displacement of the specimen 16 and for detecting the amount of displacement.

The control system 36 can further control the electron beam system 30 and the defector 34 for acquiring and storing image data. The image data can represent an Image of the specimen 26, probes 14 and 24 or other structure(s) within the chamber 28, for example. By acquiring image data of the specimen 26 concurrently with displacement of the specimen, the properties of the specimen being determined based on the at least one parameter and the acquired image data. For example, the image data can be utilized to compute an instantaneous diameter of the specimen, which can be further employed in conjunction with the measure force and displacement to compute true stress and true strain for the specimen. A user can also employ the image that is generated to facilitate attachment of the specimen between the probes, such as described herein. The image data acquired during measurements further can be utilized, individually or in conjunction with data (e.g., samples of output signals) from the transducer 18, to determine certain properties of the specimen 26.

The system 10 can also include one or more input/output (I/O) devices 40. The I/O device 40 can include for example a display for displaying an image derived from the particles or electron detected via the detector 34. The I/O device can also include a man machine interface that a user can utilize to input information and control settings and/or parameters associated with the system 10.

Figure 2:
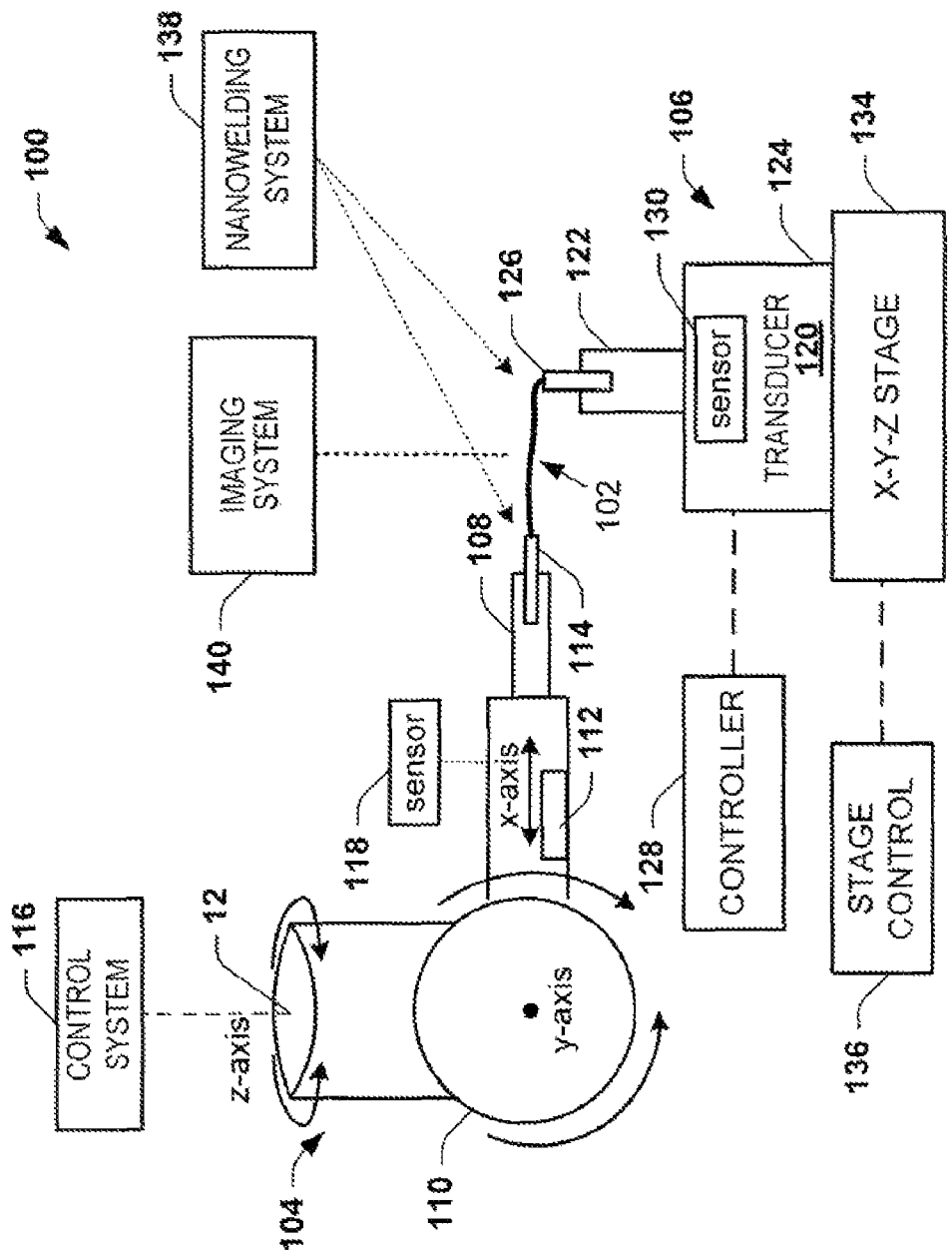
FIG. 2 depicts an example of a system for measuring properties of a specimen according to an aspect of the invention.

FIG. 2 illustrates another example of a system 100 that can be utilized for in situ measurement of properties of microstructures and nanostructures, such as a specimen of a micro- or nanowire, indicated at 102. The apparatus 100 of includes a positioning system 104 and a transducer 106, which may apply physical forces or displacements upon the specimen 102.

For example, the positioning apparatus 104 includes a first end 108, a second end 110 spaced apart from the first end. An actuator, schematically demonstrated at 112, is configured to move at least the first end 108 relative to the second end 110. For instance, the actuator 112 can causes the first end 108 to move parallel to (or along) an x-axis. A first probe 114 is attached to and extends from the first end 108 of the positioning system 104. In accordance with an example embodiment of the invention, the positioning system 104 may be implemented as a MM3A micromanipulator, manufactured by Kleindiek Nanotechnik GmbH, such as described herein. As a further example, the probe 114 can be a platinum iridium probe, such as model 7X, manufactured by the Micromanipulator Company Inc. with a tip radius of 100 nm. Other probes of other materials (e.g., tungsten) can also be utilized.

A control system 116 associated with the positioning system 104 can control the motion of the first end 108 in three dimensional space, such as by controlling the actuator 112 as well as additional actuators (not shown) associated with other moveable, parts of the system. For instance, the control system 116 may control the motion and position of the first end 108 relative to the transducer 106, such as by controlling the transducer 112. At least one sensor 118 for sensing the position of the first end of 108 in three-dimensional space may be incorporated in or coupled with the positioning system 104.

The transducer system 106 includes a transducer 120 that is configured to provide for at least one of controlled movement and force sensing. The transducer system 106 includes an end portion 122 that extends from a transducer body portion 124. The transducer 120 can be configured to move the end portion 122, such as by imparting linear force onto the end portion along at least one direction or along a plurality of directions. A second probe 126 extends from the end portion 122 substantially normal to the axis along which the probe 114 may traverse. The second probe 126, for example, may include a substantially flat or curved probe tip to facilitate attachment of the specimen. The second probe 126 may be a custom-made actuator probe tip that can be directly affixed onto the end portion 122 of the transducer system 106.

A controller 128 associated with the transducer 120 controls operation of the transducer, including to effect movement of the end portion 122 and the attached probe 126. At least one sensor 130 can be provided for sensing the position (or displacement) of the end portion 122 relative to the transducer body portion 124. The sensor 130 may be is incorporated into the transducer 120 as shown schematically in FIG. 2. The transducer system 106 can be mounted to an x-y-z stage 134. A stage control block. 136 can control positioning of the stage along the x-y-z directions associated with the stage. The stage 134, for example, can be a moveable stage of an electron microscope in connection with which the system 100 can be implemented.

By way of further example, the transducer 120 can be implemented as a three-plate capacitive plate transducer manufactured by Hysitron, Inc., such as can be configured to provide output signals indicative of both force and displacement. The Hysitron three-plate capacitor includes the sensors 130 capable of characterizing the displacement of its distal end portion 122 end relative to the transducer body portion 124. The force in the specimen 102 attached between the probes 114 and 126 can also be imparted by the transducer 120, such as by applying electrostatic voltage to one or more of the plates. Alternatively, one or more sensors can be operatively coupled with the transducer system 106 to provide for sensing parameters associated with the transducer system.

A plurality of sensors (e.g., sensors 118 and 130) may be included in the system 100 for sensing parameters that characterize properties of the specimen 102 during in situ testing. The plurality of sensors 118 and 130 for characterizing the properties of the specimen 102 may be present in or coupled with the positioning system 104, the transducer system 106, or both systems. One skilled in the art will appreciate that the sensors can characterize physical quantities including but not limited to force, temperature, relative position or displacement, and electrical current/voltage.

The system 100 may also include at least one nanowelding system 138 that is capable of attaching the specimen to the first probe 114 and to the second probe 126. The nanowelding system 138 may also require the use of welding material to complete attachment of the material sample to the probe. For example, The nanowelding system 138 can be employed to completes attachment of the specimen 102 to the probes 114 and 126 by a nanowelding process such as electron-beam induced deposition (EBID) or ion-beam induced deposition (IBID). The welding material utilized by nanowelding system 138 to attach the material sample to each of the probes 114 and 126 may be contaminants in the chamber or gas injected from a micro-gas injection system of the nanowelding system 138.

The system 100 may also include at least one imaging system 140 capable of examining the system and the specimen 102. The imaging system thus can be employed to facilitate the attachment of the specimen to the probes 114 and 126 as well as to obtain visual representation of the specimen during testing. The imaging system 140 may include at least one control system (not shown) for controlling the imaging system and its components. One skilled in the art will appreciate various types of electron microscopes that may be used to image the system and the specimen. One skilled in the art will also recognize that other imaging devices could be used alone or in combination to examine the system and specimen 102.

By way of further example, to use the system 100 to measure and characterize properties of the specimen 102, the specimen is attached by the nanowelding system 138 as to extend between the probes 114 and 122. The controller 128 can actuate the transducer 120 to move distal end portion 122 of the transducer system 106 and the probe 126 to displace the specimen, such as along its longitudinal axis. Alternatively or in addition, the control system 116 can be employed to actuate the positioning system 104 to move the prove 114 for displacing the specimen 102. The corresponding displacement of the specimen 102 can be sensed by the transducer 120, such as described herein. Additional properties, such as force, displacement, temperature, and electrical current versus voltage in the specimen 102 may also be sensed by appropriate sensors operatively associated with or coupled to the specimen. As described herein, physical properties of the specimen may also be sensed at the transducer 120 by the sensor(s) 130.

The resulting displacement and force characterizations can be used to obtain the engineering-stress versus engineering-strain behavior of the specimen. It should be noted that the displacement measurements are differences between the original positions and the strained positions, and therefore the system 100 is able to provide characterization of properties of the specimen regardless of whether the first probe 114 is moved, the second probe 126 is moved, or both probes are moved. The imaging system 140 and associated control system can further provide images of the apparatus 100 and the specimen 102 acquired during the in situ measurements for use in evaluating and determining properties of the sample.

Figure 3:
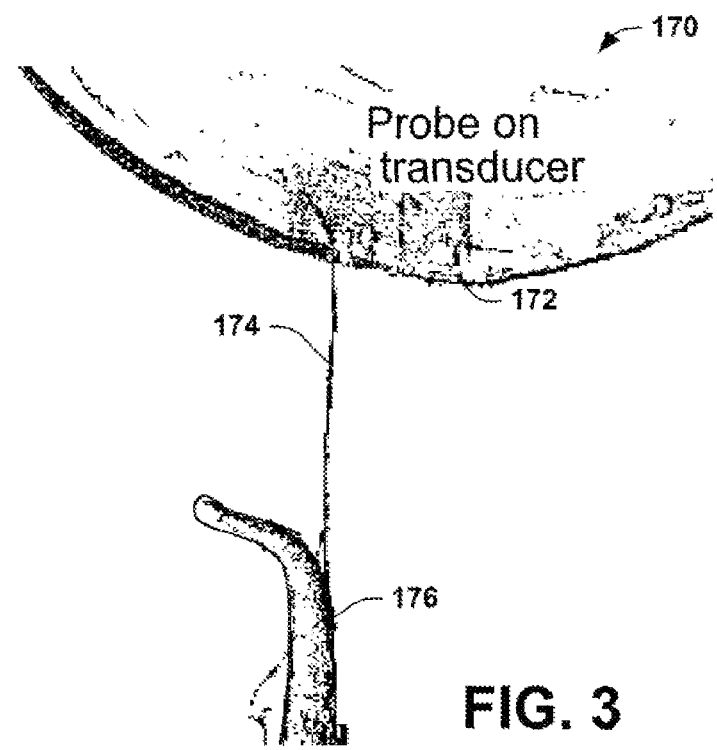
FIG. 3 is a microphotograph of a first end of a specimen attached between probes according to an aspect of the invention.

FIG. 3 is a microphotograph 170 of a portion of one embodiment of the apparatus implemented according to an aspect of the invention. In the example of FIG. 3, a first probe 172 is attached to a length of a specimen 174, in the case a microwire of Polyaniline. The probe 172 corresponds to the probe that is attached to a force and displacement transducer, such as shown and described with respect to FIGS. 1 and 2. The specimen 174 is attached to a second probe 176, such as described with respect to the embodiments of FIGS. 1 and 2. As described herein an IBID process or an EBID process could be used to attach the specimen between the probes 172 and 176.

Figure 4:
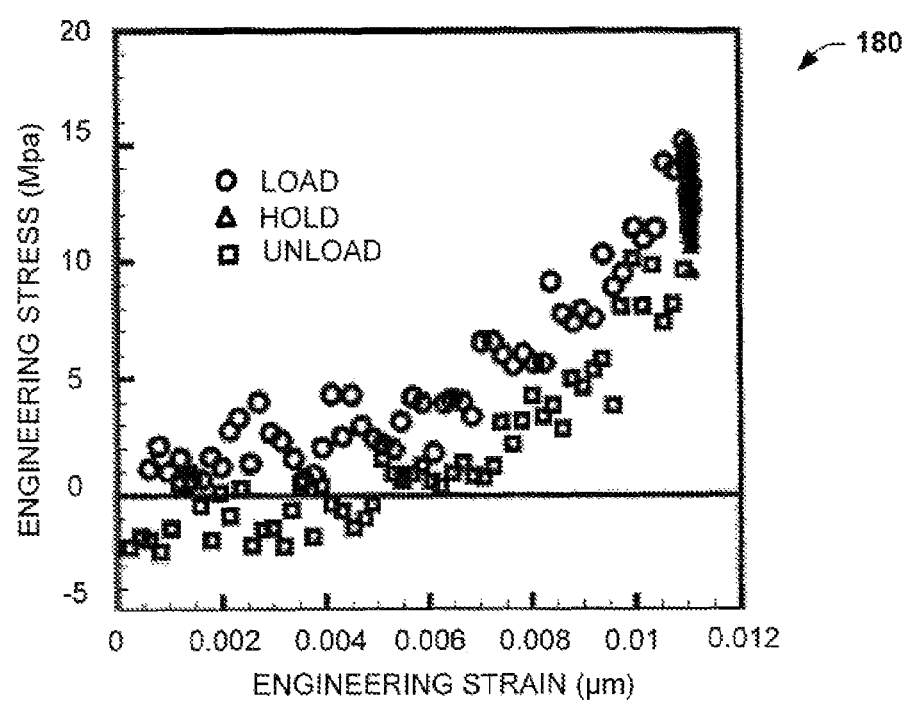
FIG. 4 is an example of a graph of engineering stress versus engineering strain for typical results that can be obtained according to an aspect of the invention.

FIG. 4 depicts an example graph 180 in which engineering stress is plotted as a function of engineering strain. The graph 180 thus characterizes mechanical behavior of specimen, such as can be obtained by a system operating in accordance with an aspect of the present invention. The example data represented in FIG. 4 illustrates the behavior for a one micrometer diameter Polyaniline wire having been displaced approximately 2 μm, held in place for about ten seconds and subsequently unloaded to its initial position. The open circles denote the engineering stress plotted against engineering strain of the material sample during the loading phase. The triangles represent engineering stress and strain during the hold phase. The open-squares indicate the engineering stress and strain during the unloading phase.

Figure 5:
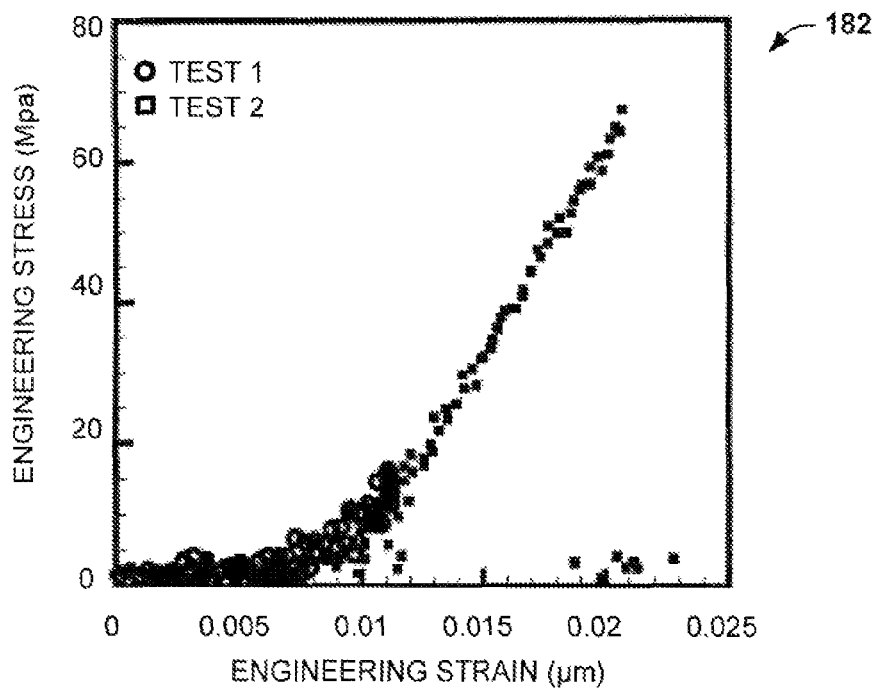
FIG. 5 is another example of a graph of engineering stress versus engineering strain for typical results that can be obtained according to an aspect of the invention.

FIG. 5 provides a second example graph 182 in which engineering stress is plotted as a function of engineering strain, such as can be measured in a system operating in accordance with an aspect of the present invention. In the example of FIG. 5, the same Polyaniline fiber as used in FIG. 4 is used, and in this case the fiber was actuated by the transducer to a displacement of approximately 5 μm. The engineering stress plotted against the engineering strain is represented by the filled-squares for displacement during the loading phase for the second test. The results from the 2 μm test (TEST 1) corresponding to FIG. 4 are included in the graph of FIG. 5 (represented by circles) for sake of comparison with the results of the 5 μm displacement test (TEST 2). In this case, the micro-weld/bond between the material specimen and the first end of the second probe tip failed prior to the material sample. From this data the material's yield strength can be determined to be at least about 67.3 MPa, which is larger than that reported for most bulk samples of like polymeric materials.

Figure 6:
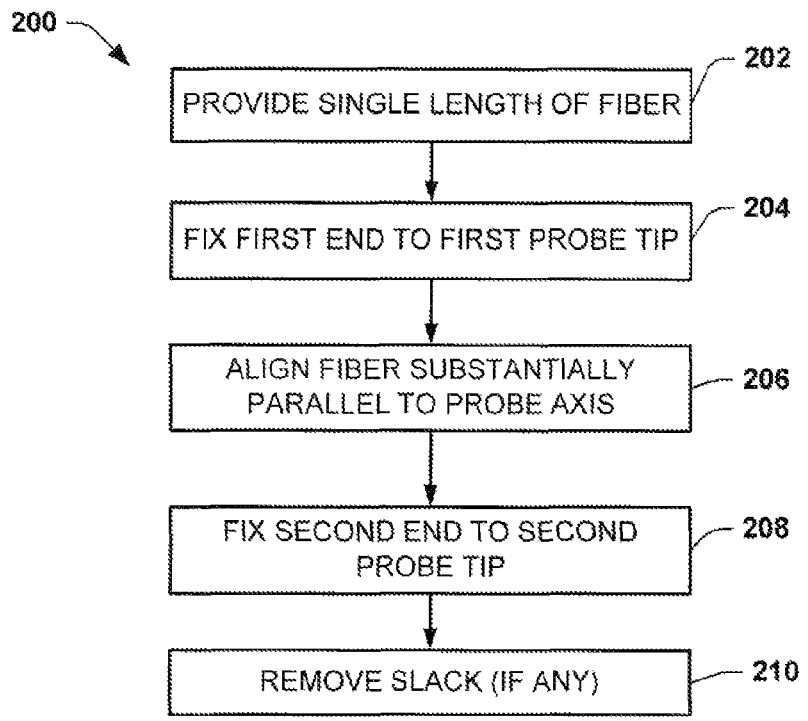
FIG. 6 is a flow diagram of an example method that, can be employed to set up a system for measuring properties of a specimen according to an aspect of the invention.
Figure 7:
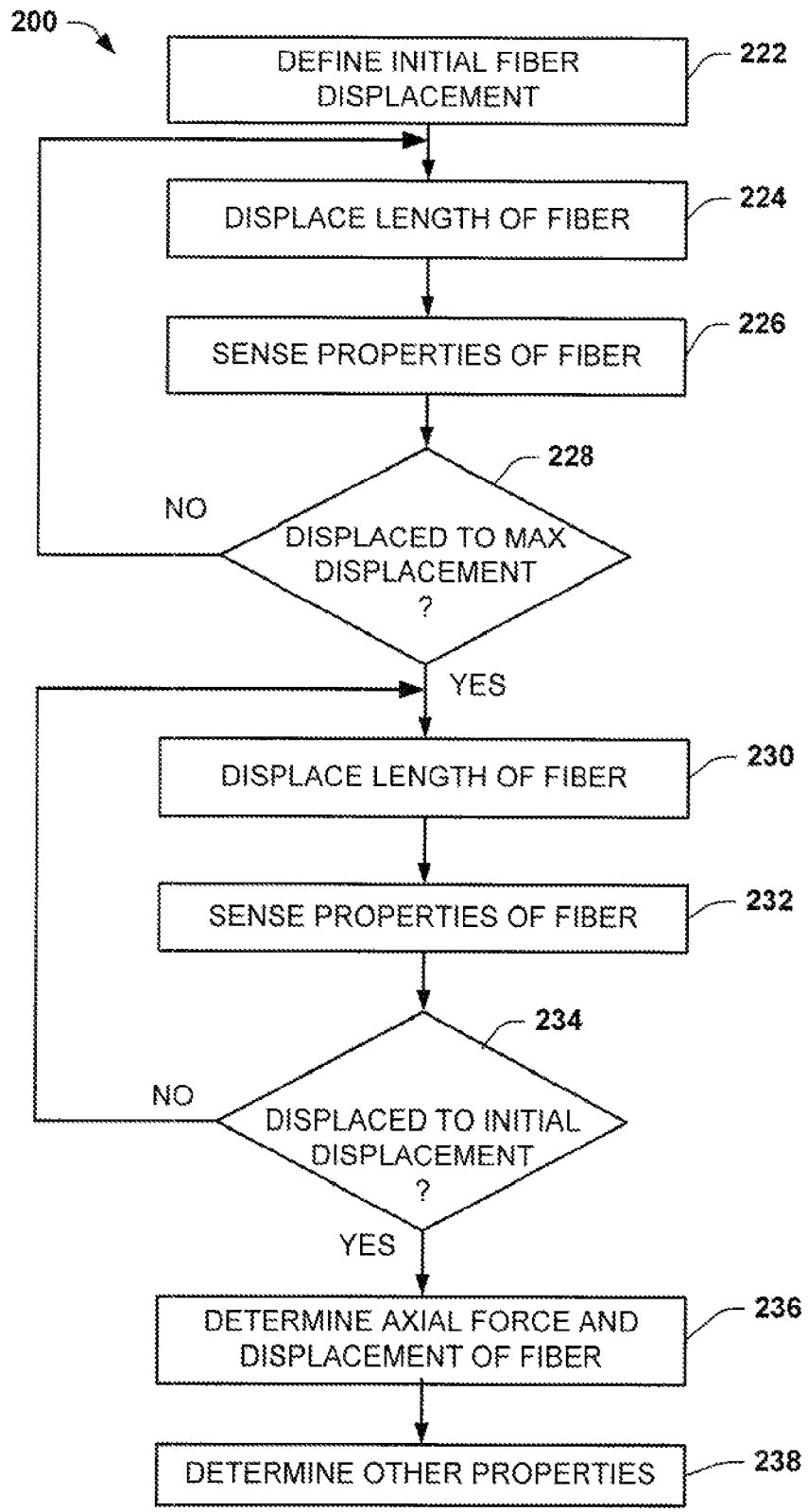
FIG. 7 is a flow diagram of an example method that can be utilized for measuring properties of a specimen according to an aspect of the invention.

In view of the structural and functional features described above, certain methods will be better appreciated with reference to FIGS. 6 and 7. It is to be understood and appreciated that the illustrated actions, in other embodiments, may occur in different orders or concurrently with other actions. Moreover, not all features illustrated in FIGS. 6 and 7 may be required to implement a method according to the subject invention. It is to be further understood that certain portions of following methodologies can be implemented via hardware (e.g., control circuitry programmed to operate various devices and associated test equipment, sensors etc.), software (e.g., stored in a computer readable medium or as executable instructions running on one or more computers or controllers), or as a combination of hardware and software. As a further example, the methods of FIGS. 6 and 7 can be implemented using the systems shown and described with respect to FIGS. 1 and 2.

FIG. 6 depicts an example of a method 200 that can be utilized to set up a measurement system for performing measurements in accordance with an aspect of the invention. The method begins at 202 in which a single length of a fiber is provided. The single length of the fiber can be obtained, for instance, by isolating the fiber from a non-woven mat. The fiber can be a length of a single microfiber or nanowire thus corresponding to a one dimensional material. For example, the single length of fiber can be isolated by utilizing a position apparatus (e.g., a micromanipulator or nanomanipulator) within an electron microscope system, such as an SEM system. At 204, the first end of the fiber is attached to a first probe tip. For example, an IBED process or an EBID process can be utilize to weld the first end of the fiber to the probe tip.

At 206, the fiber is aligned substantially parallel to the probe axis. For example, a positioning apparatus, such as a micromanipulator or nanomanipulator, can be utilized to align the fiber substantially parallel to the probe access. The isolated fiber can then be transported to the actuator probe also residing within the chamber of the electron microscope system. At 208, the second end of the fiber can be attached to the second probe tip. For example, an IBED process or IBID process can be utilized to attach the free end of the fiber to the second probe tip. As described herein, the second probe tip can be attached to and extend from a transducer located on a movable stage of the microscope system. For example, the transducer may be implemented utilizing a one-dimensional or multi-dimensional force and displacement transducer, such as is commercially available from Hysitron, Inc. As described herein, the transducer can be implemented to measure a displacement by capacitive means and can generate forces by electrostatic means. That is, the transducer can be used for both applying force to displace the specimen and for measuring the applied force during testing. At 210, any remaining slack in the fiber can be removed, such as by actuating the transducer to move the second probe tip or by activating the positioning device to move the first probe tip relative to the loading axis of such probe tip.

FIG. 7 depicts an example of a method that can be utilized for measuring properties of the length of fiber (i.e., a specimen) that has been connected between a pair of probes such as shown and described with respect to FIG. 6. The method of FIG. 7 begins at 222 in which the initial (or starting) fiber displacement is defined. The initial fiber displacement corresponds to the relative positions between the first probe, which is attached to the nanomanipulator, and the second probe, which is attached to the transducer. The electron microscope can also be utilized to measure the displacement by acquiring images throughout the method 200.

At 224, the length of the fiber is displaced. The displacement can occur continuously at a predetermined rate of increasing displacement, such as about 0.5 micrometers per second. Other rates can be utilized, which may vary depending upon the length of fiber connected between the probes, the diameter of the fiber, as well as the composition of the fiber. The displacement of the fiber occurs in a direction that is substantially coaxial with the orientation of the fiber.

At 226, properties of the fiber are sensed. The properties being sensed can include the displacement and the applied force imparted on the length of fiber connected between the probe tips. Additional properties such as the temperature, thermal conductivity and electrical current versus voltage relationship in the fiber can also be detected by employing appropriate sensors operatively coupled with the deformation of the specimen. For example, during the testing process, the temperature of the fiber can remain fixed or it can be varied. Also, by introducing appropriate heating and sensing functionalities at the probe tips thermal conductivity of the fiber can be established. Additionally, an electrical current can be provided through the fiber as applied by an appropriate current source electrically connected with the probe tips (e.g., via circuits formed using electrically conductive paths through the positioning apparatus and the transducer) to obtain the electrical current versus voltage relationship in the fiber. It is to be appreciated that the properties can be sensed at predefined sample deformations as the length of fiber is displaced.

In FIG. 7, the length of the fiber can be displaced from its initial displacement to a maximum value. Thus at 228, a determination is made as to whether the fiber has been displaced to a maximum displacement value, which may be a predetermine value. If the determination is negative (NO), the method returns from 228 to 224 in which the length of the fiber is displaced and properties are sensed. The properties that are sensed can be stored as sample data in associated memory as part of the system for subsequent processing and computations. If the determination at 228 is affirmative (YES), indicating that the maximum displacement has been reached, the method proceeds to 230.

At 230, a second phase of the process (e.g., an unloading phase) can begin. Prior to the unloading phase, the method may include a hold phase in which applied force on the specimen can be maintained at a constant level for a specified dwell time. The unloading phase at 230 includes displacing the length of fiber from its current displacement to a reduced displacement. The displacement can occur at a predetermined rate which may be fixed or a variable over the unloading phase. At 232, the properties of the fiber are sensed and stored in appropriate memory as sample data. The property sensed at 232 can be the same properties sensed at 226. At 234 a determination is made as what to whether the fiber has been unloaded and reduced and displacement to its initial displacement defined at 222. If the determination is negative (NO) the method returns to 230 in which the fibers continually unloaded by reducing the displacements and the properties are sensed and stored in appropriate memory.

If at 234 the determination is affirmative (YES), indicating that the fiber has been returned to its initial displacement the method proceeds to 236. At 236, the axial force and displacement characteristics of the fiber during the loading phase (222 to 228) and the unloading phase (230 to 236) can be determined. The axial force and displacement further can be utilized to determine other properties of the fiber. These other properties can include engineering stress verses engineering strain. Properties further can include computing the elastic modulus of the fiber. The other properties determined at 238 may also include determining the electrical and/or thermo conductivity of the fiber or other chemical or physical or mechanical property of the fiber.

The method of FIG. 7 can be repeated over a plurality of tests, such as may include different test parameters. For instance, a plurality of tests can be implemented for a given specimen for different values of maximum displacement. Additionally or alternatively, tests can also be implemented while the specimen is held at a plurality of different temperatures over a predetermined range of temperatures. As yet another example, electrical current can be passed through the length of the specimen at one or more different levels for a set of tests. The results (e.g., including the force and displacement data, temperature data, and electrical current data) of some or all of such tests can be evaluated to characterize a variety of different properties and relationships for such specimen, such as those described herein.

Those skilled in the art will further appreciate that the methods and systems implemented in accordance with an aspect of the invention provides an approach that does not require any matching of machine compliance. That is, the approach can be utilized provide accurate measurements without requiring calibration, prior to testing. Additionally, the transducer in certain embodiments affords force and displacement resolutions that are more accurate when compared to many other existing systems. The approach further allows arbitrary deformation history to be prescribed on a nanoscale specimen during deformation. The system and methods further can enable coupled mechanical, thermal and electrical property measurements in the presence of mechanical strain and/or torsion, which can be evaluated to characterize physical properties and relationships between properties not available with many existing systems.

What have been described above are examples and embodiments of the invention. It is, of course, not possible to describe even conceivable combination of components or methodologies for purposes of describing the invention, but one of ordinary skill in the art will recognize that many further combinations and permutations of the present invention are possible. Accordingly, the invention is intended to embrace all such alterations, modifications and variations that fall within the scope of the appended claims. In the claims, unless otherwise indicated, the article "a" is to refer to "one or more than one."

What is claimed is:

1. A method for characterizing properties of a specimen comprising one of a micro-scale or nano-scale dimension, the method comprising:
    attaching a first end of the specimen to a first probe;
    attaching a second end of the specimen, which is spaced apart from the first end by an intermediate portion, to a second probe that extends from a transducer;
    causing a corresponding displacement of the specimen attached between the first probe and the second probe, wherein, prior to causing the corresponding displacement of the specimen, the method further comprises aligning the specimen to be substantially parallel with a first axis, wherein the causing the corresponding displacement of the specimen further comprises displacing of the second probe relative to the first probe to provide a corresponding change in a length of the specimen attached between the first probe and the second probe along a direction that is substantially parallel with the first axis;

acquiring at least one parameter associated with the specimen during the corresponding displacement based on at least one electrical output signal from the transducer; and determining mechanical properties of the specimen based on the at least one parameter.

2. The method of claim 1, wherein the specimen comprises one of a length of a single nanowire or a length of a single microfiber, such that a length dimension of the specimen is oriented substantially parallel to the first axis.

3. The method of claim 1, wherein each of the transducer, the first probe, the second probe and the specimen is located within a chamber of an electron microscope, the method further comprising acquiring image data of the specimen with the electron microscope during the displacing, the properties of the specimen being determined based on the at least one parameter and the acquired image data.

4. The method of claim 1, wherein the properties of the specimen further comprise force and displacement of the specimen based on the at least one parameter acquired during the corresponding displacement of the specimen.

5. The method of claim 1, further comprising determining at least one of electrical conductivity of the specimen, electrical resistance of the specimen, and elastic modulus of the specimen based on the at least one parameter acquired during the corresponding displacement of the specimen.

6. The method of claim 1, further comprising repeating the causing, the acquiring and the determining for the specimen.

7. A method for characterizing properties of an elongated specimen comprising one of a micro-scale or nano-scale dimension, the method comprising:

attaching a first end of the specimen to a first probe;

attaching a second end of the specimen to a second probe that extends from a transducer, the transducer being configured to impart substantially linear force along at least one direction;

aligning the specimen to extend between the first probe and the second probe along an axis having a defined orientation relative to the at least one direction;

actuating the transducer to impart the substantially linear force along a given direction that causes a corresponding displacement of the specimen along the axis; and measuring parameters associated with the specimen during the corresponding displacement based on at least one output signal from the transducer, wherein the at least one output signal comprises an electrical signal representing a mechanical property of the specimen.

8. The method of claim 7, wherein the measuring further comprises measuring force and displacement associated with the specimen during the corresponding displacement.

9. The method of claim 8, further comprising determining stress and strain of the specimen during at least a portion of the corresponding displacement.

10. The method of claim 8, further comprising acquiring image data for the specimen during the corresponding displacement.

11. The method of claim 7, further comprising measuring at least one of temperature and electrical resistance of the specimen during the corresponding displacement.

12. The method of claim 7, wherein the method further comprises:

controlling the transducer to cause the corresponding displacement of the specimen along the axis; and providing output signals from the transducer corresponding to the parameters measured during the corresponding displacement of the specimen.

13. The method of claim 12, wherein the second probe extends from the transducer substantially orthogonal to the axis, the second probe including a probe tip at a distal end thereof that substantially intersects with the axis, such that the actuating of the transducer maintains substantial alignment of the specimen with the axis while causing the corresponding displacement of the specimen.

14. The method of claim 13, wherein the measuring of parameters further comprises measuring a first force component substantially parallel with the axis and a second force component substantially normal to the axis based on corresponding output signals from the transducer.

15. The method of claim 13, wherein the attaching of the first end comprises nanowelding the first end of the specimen to a probe tip of the first probe and the attaching of the second end comprises nanowelding the second end of the specimen to the probe tip of the second probe.

16. A method for characterizing properties of a specimen comprising one of a micro-scale or nano-scale dimension, the method comprising:

attaching a first end of the specimen to a first probe;

attaching a second end of the specimen, which is spaced apart from the first end by an intermediate portion, to a second probe that extends from a transducer;

causing a corresponding displacement of the specimen attached between the first probe and the second probe;

acquiring at least one parameter associated with the specimen during the corresponding displacement based on at least one electrical output signal from the transducer; and determining mechanical properties of the specimen based on the at least one parameter;

wherein each of the transducer, the first probe, the second probe and the specimen is located within a chamber of an electron microscope, the method further comprising acquiring image data of the specimen with the electron microscope during the displacement of the specimen, the properties of the specimen being determined based on the at least one parameter and the acquired image data;

wherein each of the attaching of the first end and the attaching of the second comprises nanowelding within the chamber.

17. A method for characterizing properties of a specimen comprising one of a micro-scale or nano-scale dimension, the method comprising:

attaching a first end of the specimen to a first probe;

attaching a second end of the specimen, which is spaced apart from the first end by an intermediate portion, to a second probe that extends from a transducer;

actuating the transducer to cause corresponding displacement of the specimen, which is attached between the first probe and the second probe, substantially parallel to a first axis;

acquiring at least one parameter associated with the specimen during the corresponding displacement based on at least one electrical output signal from the transducer;

measuring force associated with the specimen during the corresponding displacement of the specimen based on the at least one output signal from the transducer; and determining mechanical properties of the specimen based on the at least one parameter.

18. The method of claim 17, wherein the second probe extends from the transducer substantially orthogonal to the first axis and includes a probe tip at a distal end thereof that substantially intersects with an axis that extends longitudinally through the first probe, such that the actuating of the transducer maintains alignment of the specimen with the axis while causing the corresponding displacement of the specimen.

19. The method of claim 18, wherein the measuring of force further comprises measuring a first force component substantially parallel with the axis and a second force component substantially normal to the axis based on output signals from the transducer corresponding to the at least one parameter.

20. The method of claim 19, further comprising ascertaining an indication of the alignment of the specimen relative to the axis based on the first force component and the second force component.

21. The method of claim 20, further comprising aligning the specimen relative to the axis based on the indication of the alignment of the specimen.

22. A method for characterizing properties of a specimen comprising one of a micro-scale or nano-scale dimension, the method comprising:

attaching a first end of the specimen to a first probe;

attaching a second end of the specimen, which is spaced apart from the first end by an intermediate portion, to a second probe that extends from a transducer;

causing a corresponding displacement of the specimen attached between the first probe and the second probe, wherein the causing the corresponding displacement further comprises:

a loading phase in which force is applied by the transducer to elongate the specimen gradually; and an unloading phase in which the applied force is gradually removed to reduce a length of the specimen;

acquiring at least one parameter associated with the specimen during the corresponding displacement based on at least one electrical output signal from the transducer; and determining mechanical properties of the specimen based on the at least one parameter.

23. The method of claim 22, wherein the force is applied during the loading phase to elongate the specimen at a predetermined increasing rate and the force is removed during the unloading phase to decrease the length of the specimen at a predetermined decreasing rate.

* * * * *